United States Patent
Bremmer et al.

[11] Patent Number: 5,906,859
[45] Date of Patent: May 25, 1999

[54] METHOD FOR PRODUCING LOW DIELECTRIC COATINGS FROM HYDROGEN SILSEQUIOXANE RESIN

[75] Inventors: Jeffrey Nicholas Bremmer; Youfan Liu, both of Midland, Mich.

[73] Assignee: Dow Corning Corporation, Midland, Mich.

[21] Appl. No.: 09/113,347

[22] Filed: Jul. 10, 1998

[51] Int. Cl.⁶ .................................................. B05D 3/02
[52] U.S. Cl. ........................ 427/226; 427/58; 427/240; 427/379; 427/387
[58] Field of Search .................................. 427/226, 240, 427/58, 379, 387

[56] References Cited

U.S. PATENT DOCUMENTS

| | | | |
|---|---|---|---|
| 3,615,272 | 10/1971 | Collins et al. | 23/366 |
| 4,756,977 | 7/1988 | Haluska et al. | 427/226 |
| 4,808,653 | 2/1989 | Haluska et al. | 524/398 |
| 4,822,697 | 4/1989 | Haluska et al. | 428/698 |
| 4,999,397 | 3/1991 | Weiss et al. | 524/755 |
| 5,008,320 | 4/1991 | Haluska et al. | 524/361 |
| 5,010,159 | 4/1991 | Bank et al. | 528/23 |
| 5,063,267 | 11/1991 | Hanneman et al. | 524/284 |
| 5,210,160 | 5/1993 | Saive et al. | 526/116 |
| 5,290,394 | 3/1994 | Sasaki | 156/613 |
| 5,370,903 | 12/1994 | Mine et al. | 427/226 |
| 5,370,904 | 12/1994 | Mine et al. | 427/226 |
| 5,372,842 | 12/1994 | Mine et al. | 427/226 |
| 5,380,555 | 1/1995 | Mine et al. | 427/226 |
| 5,416,190 | 5/1995 | Mine et al. | 528/492 |
| 5,441,765 | 8/1995 | Ballance et al. | 427/228 |
| 5,547,703 | 8/1996 | Camilletti et al. | 427/126.3 |

FOREIGN PATENT DOCUMENTS

| | | |
|---|---|---|
| 59-178749 | 10/1984 | Japan . |
| 60-86017 | 5/1985 | Japan . |
| 63-107122 | 5/1988 | Japan . |

*Primary Examiner*—Janyce Bell
*Attorney, Agent, or Firm*—Sharon K. Severance

[57] ABSTRACT

This invention pertains to a method of producing low dielectric coatings from hydrogen silsesquioxane resin. The method for producing the coatings comprises applying a film of hydrogen silsesquioxane resin onto a substrate and thereafter curing the film by first heating at a temperature of about 325° C. to 350° C. thereafter heating at a temperature of about 400° C. to 450° C. until the normalized SiH bond density is 50 to 80%. This two step curing process produces films having lower dielectric constant and improved mechanical properties.

10 Claims, No Drawings

METHOD FOR PRODUCING LOW DIELECTRIC COATINGS FROM HYDROGEN SILSEQUIOXANE RESIN

FIELD OF THE INVENTION

This invention pertains to a method of producing low dielectric coatings from hydrogen silsesquioxane resin. The method for producing the coatings comprises applying a coating of hydrogen silsesquioxane resin onto a substrate and thereafter curing the coating by first heating at a temperature of about 325° C. to 350° C. for a period of about 15 minutes to 1 hour and thereafter heating at a temperature of about 400° C. to 450° C. until the normalized SiH bond density is 50 to 80%. This two step curing process produces films having lower dielectric constant and improved mechanical properties.

BACKGROUND OF THE INVENTION

The use of hydrogen silsesquioxane resin to produce ceramic or ceramic-like coatings on electronic substrates is known in the art. Numerous methods have been developed to cure the hydrogen silsesquioxane resin to produce the coatings. Under known thermal processing and cure conditions (i.e., 1 minute hold at each of three serial hot plates followed by 1 hour in a furnace with a nitrogen atmosphere) dielectric constants of 2.9–3.0 are achieved.

Coatings having a dielectric constant of 2.9–3.0 are suitable for 0.25 micron and larger electronic devices. However, coatings having lower dielectric constants (Dk) are required for smaller device structures (i.e. 0.13–0.18 micron). Several methods have been proposed for curing the hydrogen silsesquioxane resin to produce a lower dielectric constant in the coating. However, these methods often require difficult and expensive processing to produce the low Dk coatings. For example, U.S. Pat. No. 5,441,765 to Ballance et al. discloses a method for producing coatings from hydrogen silsesquioxane resin wherein the cured coating has a Dk of 2.8 to 4.5. The process disclosed in U.S. Pat. No. 5,441,765 comprises applying the hydrogen silsesquioxane resin onto the device, heating the coated device for time sufficient to produce an Si—O containing ceramic coating and thereafter exposing the Si—O containing ceramic coating to an annealing atmosphere containing hydrogen gas.

U.S. Pat. No. 5,547,703 to Camilletti et al. discloses a method for producing low Dk coatings. The method comprises applying the hydrogen silsesquioxane resin on the electronic substrate; heating in ammonia and moisture; thereafter heating in anhydrous ammonia and finally heating in oxygen to anneal the coating. The Dk of the coatings produced by this method was reported to be between 2.42 and 4.92.

It has now been found that through thermal processing of hydrogen silsesquioxane resin that coatings having a dielectric constant of 2.7 to 2.9 can be produced. The thermal processing comprises curing the hydrogen silsesquioxane by first heating at a temperature of about 325° C. to 350° C. thereafter heating at a temperature of about 400° C. to 450° C. until the normalized SiH bond density is 50 to 80%.

It is therefore an object of this invention to show a method for curing hydrogen silsesquioxane resin to produce coatings having a dielectric constant of 2.7 to 2.9.

SUMMARY OF THE INVENTION

This invention pertains to a method for producing insoluble ceramic-like coatings having a dielectric constant of 2.7 to 2.9 from hydrogen silsesquioxane resin. The method comprises applying hydrogen silsesquioxane resin onto a substrate and first heating the hydrogen silsesquioxane resin on the substrate at a temperature of about 325° C. to 350° C. for a period of about 15 minutes to 2 hours and further heating at a temperature of about 400° C. to 450° C. until the normalized SiH bond density is 50 to 80%. The resulting coating has a dielectric constant of 2.9 or less, preferably 2.7 to 2.9. The coatings are useful as interlayer dielectric coatings on semiconductor devices.

DETAILED DESCRIPTION OF THE INVENTION

The hydrogen silsesquioxane resin useful in herein include hydridosiloxane resins comprising units of the formula $HSi(OH)_x(OR)_yO_{z/2}$, in which each R is independently an organic group or a substituted organic group which, when bonded to silicon through the oxygen atom, forms a hydrolyzable substituent; x=0 to 2; y=0 to 2; z=1 to 3; and x +y+z=3. Examples of R include alkyls such a methyl, ethyl, propyl, butyl, and others; aryls such as phenyl; and alkenyls such as allyl or vinyl. These resins may be essentially fully condensed $(HSiO_{3/2})_n$ where n is 8 or greater or they may be only partially hydrolyzed (i.e., containing some Si—OR) and/or partially condensed (i.e., containing some Si—OH).

The structure of the resin is not specifically limited. The structure of the hydrogen silsesquioxane resin may be what is generally known at ladder-type, cage-type or mixtures thereof. The resins may contain endgroups such as hydroxyl groups, triorganosiloxy groups, diorganohydrogensiloxy groups, trialkoxy groups, dialkoxy groups and others. Although not represented by the structure, the resins may also contain a small number (e.g. less than about 10%) of the silicon atoms which have either 0 or 2 hydrogen atoms attached thereto and/or a small number of SiC groups such as $CH_3SiO_{3/2}$ or $HCH_3SiO_{2/2}$ groups.

The above hydrogen silsesquioxane resins and method for their production are known in the art. For example, Collins et al. in U.S. Pat. No. 3,615,272, herein incorporated by reference, teach the production of an essentially fully condensed hydrogen silsesquioxane resin (which may contain up to 100–300 ppm silanol) by a process comprising hydrolyzing trichlorosilane in a benzenesulfonic acid hydrate hydrolysis medium and then washing the resultant resin with water or aqueous sulufric acid. Similarly, in U.S. Pat. No. 5,010,159 to Bank et al., herein incorporated by reference, teach a method comprising hydrolyzing hydridosilanes in an arylsulfonic acid hydrate hydrolysis medium to form a resin which is then contacted with a neutralizing agent.

Other hydridosiloxane resins, such as those described by Frye et al. in U.S. Pat. No. 4,999,397; those described by Bergstrom et al. in U.S. Pat. No. 5,210,160, both hereby incorporated by reference, those produced by hydrolyzing an alkoxy or acyloxy silane in an acidic, alcoholic hydrolysis medium; those described in Kokai Patent Nos. 59-178749, 60-86017 and 63-107122; or any other equivalent hydridosiloxane,will also function herein.

In a preferred embodiment of the invention, specific molecular weight fractions of the above H-resins may also be used in this process. Such fractions and methods for their preparation are taught in U.S. Pat. No. 5,063,267 to Hanneman et al. and in U.S. Pat. No. 5,416,190 to Mine et al., which are hereby incorporated by reference. A preferred fraction comprises material wherein at least 75% of the polymeric species have a molecular weight above about 1200 and a more preferred fraction comprises material wherein at least 75% of the polymeric species have a number average molecular weight between about 1200 and about 100,000.

The hydrogen silsesquioxane resin may contain other components so long as these components do not interfere with the integrity of the coating or increase the dielectric constant of the coating. Known additives include catalyst such as platinum, rhodium or copper catalyst which increase the rate and/or extent of cure of the hydrogen silsesquioxane resin as described in U.S. Pat. No. 4,822,697 to Haluska et al., herein incorporated by reference.

Ceramic oxide precursors may also be used in combination with the hydrogen silsesquioxane resin. The ceramic oxide precursors useful herein include compounds of various metals such as aluminum, titanium, zirconium, tantalum, niobium and/or vanadium as well as various non-metallic compounds such as those of boron or phosphorous which may be dissolved in solution, hydrolyzed and subsequently pyrolyzed at relatively low temperature to form ceramic oxides. Ceramic oxide precursors useful herein are described in U.S. Pat. Nos. 4,808,653, 5,008,320 and 5,290,394, herein incorporated by reference.

The hydrogen silsesquioxane resin is typically applied to the substrate as a solvent dispersion. Solvents which may be used include any agent or mixture of agents which will dissolve the hydrogen silsesquioxane resin to form a homogeneous liquid mixture without affecting the resulting coating. These solvents can include alcohols such as ethyl alcohol or isopropyl alcohol; aromatic hydrocarbons such as benzene or toluene; alkanes such as n-heptane, dodecane or nonane; ketones such as methyl isobutyl ketone; esters; glycol ethers; or siloxanes such a linear (e.g. hexamethyldisiloxane, octamethyldisiloxane and mixtures thereof) and cyclic dimethylpolysiloxanes. The solvent is present in an amount sufficient to dissolve the hydrogen silsesquioxane resin to the concentration desired for application. Typically the solvent is present in an amount of 20 to 99.9 wt %, preferably from 70 to 95 wt % based on the weight of hydrogen silsesquioxane resin and solvent.

Specific methods for application of the hydrogen silsesquioxane resin to the substrate include, but are not limited to spin coating, dip coating, spray coating, flow coating, screen printing or others. The preferred method for application is spin coating. When a solvent is used, the solvent is allowed to evaporate from the coated substrate resulting in the deposition of a hydrogen silsesquioxane resin film on the substrate. Any suitable means for evaporation may be used such as simple air drying by exposure to an ambient environment, by the application of a vacuum, or mild heat (<50° C.) or during the early stages of the curing process. It should be noted that when spin coating is used, the additional drying method is minimized as the spinning drives off the solvent.

Following application to the substrate, the hydrogen silsesquioxane resin film is cured to an insoluble ceramic-like coating having a normalized SiH bond density of 50 to 80%, preferably 50 to 70%, by first heating at a temperature of about 325° C. to 350° C. and thereafter heating at a temperature of about 400° C. to 450° C. By "normalized SiH bond density" it is meant the amount of SiH in the insoluble ceramic-like coating based on the SiH in the uncured hydrogen silsesquioxane resin film on the substrate after the removal of any solvent but prior to heating to cure. By "insoluble ceramic-like coating" it is meant a coating that is essentially not soluble in the solvent from which the hydrogen silsesquioxane resin is deposited onto the substrate or any solvent delineated above as being useful for the application of the hydrogen silsesquioxane resin. The insoluble ceramic-like coatings contain amorphous silica ($SiO_2$) materials as well as amorphous silica-like materials that are not fully free of carbon, silanol (SiOH) and/or hydrogen.

The hydrogen silsesquioxane is first heated at a temperature of about 325° C. to 350° C. for a time sufficient to stabilize the cure environment and to ensure that the environment is inert. It is theorized that the presence of oxygen at level of greater than 10 ppm during the ramp up to and heating at a temperature of 400 to 450° C. will result in oxidation and the formation of polar groups in the insoluble ceramic-like coating thus resulting in elevated dielectric constants. Although some networking of the resin occurs during this heating phase, it is not sufficient to produce an insoluble ceramic-like coating with the desired dielectric constant and mechanical properties. Preferably the hydrogen silsesquioxane coating is heated at a temperature of about 325° C. to 350° C. for a period of 15 minutes to 1 hour. The time required will be dependent on the means being used to heat the hydrogen silsesquioxane films.

After heating at a temperature of about 325° C. to 350° C. the temperature is ramped up to about 400° C. to 450° C., preferably 425° C. to 450° C. The hydrogen silsesquioxane is held at this temperature for a time sufficient to produce a insoluble ceramic-like film having a SiH bond density of 50 to 80%, typically 15 minutes to 1 hour. Higher amounts of SiH in the insoluble ceramic-like coating produces films having inadequate mechanical properties. Any method of heating such as the use of convection oven, rapid thermal processing, hot plate, or radiant may be used herein, preferably convection oven.

The environment in which the hydrogen silsesquioxane resin coated substrate is heated at about 325° C. to 350° C. can be any environment such as nitrogen, argon, helium and an environment containing oxygen such as air, peroxides and ozone. etc. However, an inert environment must be established before ramping up to 400° C. to 450° C. By "inert environment" is meant an environment that contains less than about 10 ppm oxygen.

Lower amounts of SiH in the insoluble ceramic-like coatings are typically associated with improved mechanical properties and improved integration of the coatings in the devices. However, the conditions (i.e. high heating temperatures) required to reduce the SiH to the desired ranges results in increased dielectric properties in the coatings. The two step heating of the instant invention results in both the improved mechanical properties and the low dielectric constant. The insoluble coatings produced herein have a Dk of 2.9 or less, preferably 2.7 to 2.9.

By the above methods a thin (less than 2.5 microns) insoluble ceramic-like coating is produced on the substrate. Preferably the coatings have a thickness of 0.5 to 1.2 microns. The coating smoothes the irregular surfaces of the various substrates and has excellent adhesion properties.

The insoluble ceramic-like coatings produced herein may be produced on any substrate. However, the coatings are particularly useful on electronic substrates. By "electronic substrate" it is meant to include silicon based devices and gallium arsenide based devices intended for use in the manufacture of a semiconductor component including focal plane arrays, opto-electronic devices, photovoltaic cells, optical devices, transistor-like devices, 3-D devices, silicon-on-insulator devices, super lattice devices and the like.

The electronic substrates can be bare (i.e. no passivation), can have primary passivation or can contain one or more layers of metallization which may be bare or covered with one or more liner layers. Such primary passivation and liners can be ceramic coatings such as silica, silicon nitride, silicon carbide, silicon oxynitride, silicon oxycarbide, PSG, BPSG, and others. Primary passivation coatings and liners and methods for producing them are known to those skilled in the art. The coatings produced herein may be applied to a wafer prior to the application of any metallization. The coatings may be applied over metallization as an interlevel or interlayer dielectric or the coatings may be applied as a top passivation coating to complete the formation of the device.

Additional coatings may be applied over the insoluble coating if desired. These can include, for example $SiO_2$ coatings, silicon containing coatings, silicon carbon containing coatings, silicon nitrogen containing coatings, silicon oxygen nitrogen containing coatings, silicon nitrogen carbon containing coatings and/or diamond like coatings produced from deposition (i.e. CVD, PECVD, etc.) of amorphous SiC:H, diamond, silicon nitride. Methods for the application of such coatings are known in the art.

The method of applying an additional coating is not critical, and such coatings are typically applied by chemical vapor deposition techniques such as thermal chemical vapor deposition (TCVD), photochemical vapor deposition, plasma enhanced chemical vapor deposition (PECVD), electron cyclotron resonance (ECR), and jet vapor deposition. The additional coatings can also be applied by physical vapor deposition techniques such as sputtering or electron beam evaporation. These processes involve either the addition of energy in the form of heat or plasma to a vaporized species to cause the desired reaction, or they focus energy on a solid sample of the material to cause its deposition.

EXAMPLES

So that those skilled in the art can understand and appreciate the invention taught herein, the following examples are presented, it being understood that these examples should not be used to limit the scope of this invention found in the claims.

Dielectric Constant of the converted coating was determined by performing dielectric constant measurements on metal-insulator-semiconductor (MIS) capacitors. MIS capacitors were formed by depositing aluminum electrodes of approximately 0.15 μm unto low resistivity ($\rho \leq 0.025\ \Omega$ cm) silicon wafers coated with a thin film of the insoluble coating. A shadow mask was utilized to form aluminum electrode dots of diameter ranging from 3 to 10 mm. Impedance measurements were made across electrode dots of same diameter over frequency range of 0.1–1000 kHz using a Hewlett-Packard 4194A Impedance Analyzer. The impedance data was fit to a series RLC model from which the equivalent parallel capacitance and dielectric constant were calculated. Since impedance was characterized across the surface dot electrodes, twice the dielectric thickness was used for dielectric constant measurements.

% SiH remaining after cure was determined by FTIR. This FTIR method comprised using a Nicolet 5SXB Fourier Transform Infrared Spectrometer. A transmission sampling mode of operation was utilized. Prior to the spin coating of the wafer with the coating composition, a background spectra was collected on bare silicon wafers. The background was subtracted from a wafer having the insoluble film thereon to obtain spectra of the insoluble film only. A peak at wavenumber 2260 $cm^{-1}$ is indicative of the SiH bond density in the converted film. A ratio of this peak area per film thickness to an as spun film peak area per thickness was quantified to determine the normalized SiH bond density.

Example 1

Two sample wafers were coated with a coating composition comprising 22 wt % hydrogen silsesquioxane resin $(HSiO_{3/2})_n$ prepared according to U.S. Pat. No. 3,615,272 to Collins et al. in methyl isobutyl ketone to a pre-cured thickness of approximately 5000 Å on a SEMIX 6132U spin coater followed by sequential bakes on three open ended nitrogen purged hot plates at 150° C., 200° C., and 350° C. for one minute each. The wafers were then heated to 350° C. in a quartz tube furnace under a nitrogen atmosphere. The wafers were held at 350° C. for 30 minutes and then further heated to 450° C. under an nitrogen atmosphere. The wafers were held at 450° C. for 30 minutes and then cooled to room temperature under nitrogen. The first wafer had a Dk of 2.81. The second wafer had a Dk of 2.83. The third wafer had a normalized SiH of 58%.

Example 2

Using the procedure described in Example 1 sample wafers were coated with hydrogen silsesquioxane. The wafers were heated to 350° C. and held for 30 minutes in the environment in Table 1. The temperature was then ramped up to the cure temperature and held for an additional 30 minutes. Results and process conditions are given in Table

TABLE 1

| Run No. | Cure Temp. (° C.) | Cure Env. | Actual $O_2$ (ppm) | Pre-cure Thickness (Å) | Cured Thickness (Å) | RI | % SiH | Dk |
|---|---|---|---|---|---|---|---|---|
| 1 | 400 | Ar | 7 | 5000 | 4970 | 1.372 | 76 | |
| 2 | 400 | Ar | 7 | 4930 | 4970 | 1.371 | | 2.75 |
| 3 | 400 | $N_2$ | 50 | 4970 | 4820 | 1.381 | 58 | |
| 4 | 400 | $N_2$ | 50 | 4920 | 4740 | 1.389 | | 3.16 |
| 5 | 400 | $N_2$ | 3 | 4970 | 4940 | 1.375 | 76 | |
| 6 | 400 | $N_2$ | 3 | 4920 | 4940 | 1.374 | | 2.81 |
| 7 | 425 | Ar | 1.6 | 5000 | 4920 | 1.374 | 71 | |
| 8 | 425 | Ar | 1.6 | 4900 | 4900 | 1.375 | | 2.75 |
| 9 | 425 | $N_2$ | 3 | 5010 | 4920 | 1.374 | 69 | |
| 10 | 425 | $N_2$ | 3 | 4900 | 4890 | 1.375 | | 2.72 |
| 11 | 425 | $N_2$ | 52 | 4990 | 4710 | 1.383 | 43 | |
| 12 | 425 | $N_2$ | 52 | 4910 | 4660 | 1.384 | | 3.47 |
| 13 | 450 | Ar | 0.3 | 5010 | 4760 | 1.386 | 59 | |
| 14 | 450 | Ar | 0.3 | 4900 | 4740 | 1.386 | | 2.88 |
| 15 | 450 | $N_2$ | 53 | 5010 | 4610 | 1.388 | 35 | |
| 16 | 450 | $N_2$ | 53 | 4880 | 4540 | 1.391 | | 3.56 |
| 17 | 450 | $N_2$ | 4 | 4990 | 4780 | 1.382 | 58 | |
| 18 | 450 | $N_2$ | 4 | 4910 | 4750 | 1.383 | | 2.94 |
| 19 | 475 | Ar | 1 | 5130 | 4690 | 1.400 | 48 | |
| 20 | 475 | Ar | 1 | 5020 | 4590 | 1.410 | | 2.96 |
| 21 | 475 | $N_2$ | 5 | 5020 | 4610 | 1.409 | 44 | |
| 22 | 475 | $N_2$ | 5 | 5030 | 4580 | 1.409 | | 3.12 |
| 23 | 475 | $N_2$ | 54 | 5110 | 4620 | 1.390 | 29 | |
| 24 | 475 | $N_2$ | 54 | 5010 | 4550 | 1.399 | | 3.65 |
| 25 | 500 | Ar | 1 | 5100 | 4560 | 1.407 | 39 | |
| 26 | 500 | Ar | 1 | 4970 | 4470 | 1.410 | | 3.20 |
| 27 | 500 | $N_2$ | 5 | 5100 | 4450 | 1.417 | 37 | |
| 28 | 500 | $N_2$ | 5 | 5020 | 4490 | 1.407 | | 3.20 |
| 29 | 500 | $N_2$ | 55 | 5110 | 4480 | 1.408 | 25 | |
| 30 | 500 | $N_2$ | 55 | 5040 | 4440 | 1.412 | | 3.58 |

What is claimed is:

1. A method of forming an insoluble coating on a substrate wherein said method comprises (A) coating the substrate with a coating composition comprising a hydrogen silsesquioxane resin to form a soluble hydrogen silsesquioxane resin coating on the substrate;

(B) first heating the hydrogen silsesquioxane resin coating at a temperature of 325° C. to 350° C. for a period of 15 minutes to 1 hour (C) thereafter heating at a temperature of about 400° C. to 450° C. in an inert environment for a time sufficient to produce an insoluble ceramic-like coating having a normalized SiH bond density of 50 to 80%.

2. The method as claimed in claim 1 wherein the coating composition additionally comprises a solvent and the solvent is evaporated to form the hydrogen silsesquioxane resin coating on the substrate.

3. The method as claimed in claim 2 wherein the coating composition contains from 20 to 99.9 wt % solvent based on the weight of the coating composition.

4. The method as claimed in claim 2 wherein the solvent is selected from the group consisting of alcohols, aromatic hydrcarbons, alkanes, ketones, esters, glycol ethers, and dimethylpolysiloxanes.

5. The method as claimed in claim 1 wherein the hydrogen silsesquioxane resin is a resin having units of the formula $HSi(OH)_x(OR)_yO_{z/2}$, in which each R is independently an organic group or a substituted organic group which, when bonded to silicon through the oxygen atom, forms a hydrolyzable substituent, x=0 to 2, y=0 to 2, z=1 to 3, x+y+z=3.

6. The method as claimed in claim 1 wherein the hydrogen silsesquioxane resin is a resin having the formula $(HSiO_{3/2})_n$ wherein n has a value of at least 8.

7. The method as claimed in claim 1 wherein the substrate is coated by spin coating.

8. The method as claimed in claim 1 wherein the substrate is an electronic substrate.

9. The method as claimed in claim 1 wherein the hydrogen silsesquioxane resin coating is heated in step (B) to a temperature of 350° C.

10. The method as claimed in claim 1 wherein the heating in step (C) is at a temperature of about 425° C. to 450° C. in an inert environment is for a time sufficent to produce an insoluble ceramic-like coating having a normalized SiH bond density of about 50 to 70% and a dielectric constant of 2.7 to 2.9.

* * * * *